(12) United States Patent
Chiba

(10) Patent No.: US 7,791,156 B2
(45) Date of Patent: Sep. 7, 2010

(54) SEMICONDUCTOR DEVICE, OPTICAL MEASURING AND DETECTING DEVICE, AND METHOD OF MANUFACTURING THE SAME

(75) Inventor: Tadashi Chiba, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 327 days.

(21) Appl. No.: 12/101,383

(22) Filed: Apr. 11, 2008

(65) Prior Publication Data

US 2008/0258155 A1 Oct. 23, 2008

(30) Foreign Application Priority Data

Apr. 23, 2007 (JP) .............................. 2007-113422

(51) Int. Cl.
*H01L 27/14* (2006.01)
(52) U.S. Cl. .................. 257/435; 257/432; 257/433; 257/434; 257/E31.122
(58) Field of Classification Search ......... 257/432–435, 257/E31.122
See application file for complete search history.

(56) References Cited

U.S. PATENT DOCUMENTS

2007/0070230 A1* 3/2007 Takahashi .................. 348/308
2007/0080419 A1* 4/2007 Shizukuishi ................ 257/462
2007/0158770 A1* 7/2007 Kawahito ................... 257/431

FOREIGN PATENT DOCUMENTS

| JP | 5-38915 | 5/1993 |
| JP | 07-162024 | 6/1995 |
| JP | 3471394 | 9/2003 |

* cited by examiner

*Primary Examiner*—Kiesha R Bryant
*Assistant Examiner*—Minchul Yang
(74) *Attorney, Agent, or Firm*—Taft Stettinius & Hollister LLP

(57) ABSTRACT

Disclosed is a semiconductor device which is capable of preventing operation of the signal processing part from being unstable due to light not blocked by the light blocking layer by being obliquely incident on the signal processing part and preventing the operation of the signal processing part from being unstable due to stray charges occurring by light with which the light blocking layer is irradiated. In a light-incident part 12 having a light receiving element 36 and a signal processing circuit 38 that processes an output signal from the light receiving element 36, which are formed on a SOI substrate, a plurality of contact plugs 52 electrically connected to the light blocking layer 42 are laminated in the thickness direction of the SOI substrate along an edge of the light blocking layer that blocks the sunlight, with the uppermost of wiring layers on the signal processing circuit 38 as the light blocking layer 42. The plurality of contact plugs 52 have a ground or a potential sufficient to draw out stray charges occurring in the light blocking layer.

20 Claims, 15 Drawing Sheets

US 7,791,156 B2

SEMICONDUCTOR DEVICE, OPTICAL MEASURING AND DETECTING DEVICE, AND METHOD OF MANUFACTURING THE SAME

CROSS-REFERENCE TO RELATED APPLICATIONS

This application is a claims priority under 35 U.S.C. §119 to Japanese Patent Application Serial No. JP2007-113422 filed on Apr. 23, 2007, entitled "SEMICONDUCTOR DEVICE, OPTICAL MEASURING AND DETECTING DEVICE, AND METHOD OF MANUFACTURING THE SAME," the disclosure of which is hereby incorporated by reference.

RELATED ART

1. Field of the Invention

The present invention relates to a semiconductor device, an optical measuring device, an optical detecting device, and a method of manufacturing a semiconductor device, and more particularly, to a semiconductor device that is constructed to block light otherwise incident on a signal processing part that performs a process based on an output signal from a light receiving part, an optical measuring device using the semiconductor device, an optical detecting device using the semiconductor device, and a method of manufacturing the semiconductor device.

2. Brief Discussion of Related Art

In recent years, as the ozone layer has been disrupted due to environmental pollution by Freon gas and the like discharged in the air, a greater amount of ultraviolet (UV) light has reached the surface of the earth than ever before.

Ultraviolet light may be divided into UV-A (ultraviolet A wave: 315 nanometers to 400 nanometers), UV-B (ultraviolet B wave: 280 nanometers to 315 nanometers), and UV-C (ultraviolet C wave: 100 nanometers to 280 nanometers) based on its wavelength. UV-C cannot reach the surface of the earth because it is totally absorbed in the ozone layer. Thus, the human body is usually exposed to UV-A and UV-B. Accordingly, it is important to detect the amount of ultraviolet light exposure for protection of the human body. The World Health Organization (WHO) developed the "UV Index" in 1995, which is a measurement of how strong the ultraviolet (UV) radiation from the sun is at a particular place on a particular day.

In addition, in recent years, small portable ultraviolet light measuring devices have been commercially available. An example of such an ultraviolet measuring device includes an ultraviolet measuring filter that transmits only ultraviolet light to an ultraviolet light receiving element mounted on the ultraviolet measuring device, which may comprise a light receiving element fabricated from a semiconductor compound such as GaN, AlGaN, GaP or the like. Photoelectric current, which is obtained when the light receiving element receives the ultraviolet light, is converted to a voltage in a signal processing circuit and the voltage is digitalized through an amplifier and an ADC (Analog-Digital Converter). Thereafter, a CPU calculates the amount of ultraviolet light received by the light receiving element.

When the ultraviolet light receiving element is fabricated from a semiconductor compound, the ultraviolet light receiving element, the signal processing circuit, and so on, are required to be formed in separate chips, thereby making it difficult to achieve a small sized ultraviolet light measuring device. On the other hand, when the ultraviolet light receiving element used is fabricated from silicon-based material, the ultraviolet light receiving element, the signal processing circuit, and so on, can be formed on the same semiconductor substrate, that is, incorporated in a single chip, thereby making it possible to achieve a small sized ultraviolet light measuring device.

FIGS. 8A and 8B show an exemplary configuration of a light-incident part 12', which is a one-chip semiconductor circuit having a light receiving element 36' fabricated from a silicon-based material and a signal processing circuit 38'.

As shown in FIGS. 8A and 8B, all signal lines of the light receiving element 36' and the signal processing circuit 38' are provided in the light-incident part 12' that receives ultraviolet light and are electrically connected to an external LSI (not shown) or the like via wires 78. These wires 78 connected the signal input/output pads 40' to the package terminals 41.

As shown in FIG. 8B, an ultraviolet measuring filter 80 that transmits only ultraviolet light is provided over the light-incident part 12'. A transparent resin 82 that transmits ultraviolet light is provided below the ultraviolet measuring filter 80, and the light receiving element 36' and the signal processing circuit 38' are arranged below the transparent resin 82. In addition, a protection layer (not shown) and an interlayer film (not shown) are interposed between the transparent resin 82, the light receiving element 36' and the signal processing circuit 38'.

The light-incident part 12' is configured so that the sunlight is incident on the entire chip surface including the light receiving element 36' and the signal processing circuit 38'. With this configuration, the operation of the signal processing circuit 38' may become unstable due to the sunlight reaching the signal processing circuit 38'. Accordingly, a light blocking layer may be provided for the signal processing circuit 38'.

FIGS. 9A-9G show sectional views at certain stages of fabrication of a prior art semiconductor circuit. In this case, a light receiving element and a signal processing circuit having a light blocking layer are formed during the manufacturing process of the semiconductor circuit. The semiconductor substrate is a SOI (Silicon On Insulator) substrate.

As shown in FIG. 9A, an embedded oxide layer 90 is formed on a P type Si substrate as the SOI substrate 92, and a silicon thin layer 94 is formed on the P type Si substrate. Next, a first silicon thin layer 96 and a second silicon thin layer 98 having different thickness are formed using existing photolithography and etching methods (FIG. 9B). The light receiving element 36' is formed on the first silicon thin layer 96 and the signal processing circuit 38' is formed on the second silicon thin layer 98.

Referring to FIG. 9C, after performing an oxidation process, an implantation process is performed for portions in which the light receiving element 36' and the signal processing circuit 38' are formed, thereby forming a lightly-doped diffusing layer (lightly-doped P– type diffusing layer) 100, and then, a gate oxide layer 102 and a gate electrode 104 are formed thereon. Next, as shown in FIG. 9D, a heavily-doped N+ type diffusing layer 106 is formed. Subsequently, a heavily-doped P+ type diffusing layer 108 is formed, as shown in FIG. 9E.

Referencing FIG. 9F, a first wiring layer 50A' and a first contact plug 52A' are formed. In addition, after an interlayer film (not shown) is formed, a second wiring layer 50B' and a second contact plug 52B' are formed, and then, after an interlayer film is formed, a third wiring layer 50C' and a third contact plug 52C' are formed. In addition, after an interlayer film is formed, a fourth wiring layer 50D' to be used as a light blocking layer is formed. In addition, an interlayer film is formed on the fourth wiring layer 50D' and an ultraviolet transmission protection layer 56', which allows ultraviolet light transmission, is formed on this interlayer film as shown in FIG. 9G.

INTRODUCTION TO THE INVENTION

The present invention provides a semiconductor device, an optical measuring device, an optical detecting device, and a method of manufacturing the semiconductor device, which is capable of preventing unstable operation of a signal processing part by blocking light that is both obliquely incident and not directly incident the signal processing part.

The present invention provides a semiconductor device including: a light receiving part formed on a substrate; a signal processing part that is formed on the substrate and performs a process based on an output signal from the light receiving part; a light blocking layer arranged above the signal processing part providing a horizontal light block for blocking light directly incident to the signal processing part; and a plurality of electrical connecting members that are formed at an edge of the light blocking layer between the light blocking layer and the substrate and are spaced from each other providing a vertical light block for blocking light directly incident to the signal processing part. The plurality of electrical connecting members are connected to a ground or a potential sufficient to draw out stray charges occurring in the light blocking layer.

In the semiconductor device according to an aspect of the invention, the signal processing part performs a process based on an output signal from the light receiving part. The horizontal light blocking layer is arranged above the signal processing part, and the plurality of vertically extending electrical connecting members are formed at an edge of the light blocking layer between the light blocking layer and the substrate. The plurality of electrical connecting members are formed to be spaced from each other. The plurality of electrical connecting members are connected to a ground or a potential sufficient to draw out stray charges occurring in the light blocking layer.

In this manner, in the semiconductor device according to an aspect of the invention, since the vertically extending electrical connecting members block light reaching the signal processing part not blocked by the horizontally extending light blocking layer, it is possible to prevent unstable operation of the signal processing part otherwise occurring when light reaches the signal processing part. In addition, stray charges may occur in the light blocking layer as the light blocking layer is irradiated with the sunlight, thereby making the operation of the signal processing circuit unstable. However, since the electrical connecting members connected to the light blocking layer are connected to a ground or a potential sufficient to draw out stray charges occurring in the light blocking layer, it is possible to prevent stray charges from pooling in the light blocking layer and thus preventing unstable operation of the signal processing part as a result of stray charges pooling in the light blocking layer.

According to another aspect of the invention, there is provided a method of manufacturing a semiconductor device including a light receiving part and a light blocking layer formed on a substrate, and a signal processing part that performs a process based on an output signal from the light receiving part, including the steps of: forming a plurality of first diffusing layers constituting the light receiving layer, sources and drains of a plurality of transistors constituting the signal processing part, and a second diffusing layer fixed at a ground or a potential sufficient to draw out stray charges occurring in the light blocking layer on the substrate at once; forming electrical connecting members in the first and second diffusing layers, the sources and the drains at once; and forming the light blocking layer electrically connected to the second diffusing layer via the electrical connecting members.

In accordance with the exemplary method of manufacturing the semiconductor device, it is possible to form the electrical connecting members and the light blocking layer without increased number of forming steps over conventional manufacturing methods since the step of forming electrical connecting members in the first and second diffusing layers, the sources and the drains at once and the step of forming the light blocking layer electrically connected to the second diffusing layer via the electrical connecting members can be performed along with a step of forming contact plugs and wiring layers of the semiconductor device.

As described above, the present invention makes it possible to prevent unstable operation of the signal processing part by both blocking light obliquely incident to the signal processing part and not obliquely incident to the signal processing part. Likewise, the present invention makes it possible to prevent unstable operation of the signal processing part as a result of stray charges pooling in the light blocking layer by electrically connecting the light blocking layer to a ground or a potential sufficient to draw out stray charges.

It is a first aspect of the present invention to provide a semiconductor device comprising: (a) a light receiver formed on a substrate; (b) a signal processor formed on the substrate, the signal processor in electrical communication with the light receiver to receive an output signal from the light receiver; (c) a light blocking layer overlapping the signal processor; and (d) three or more electrical connectors interposing the light blocking layer and the substrate, where at least two of the plurality of electrical connectors are spaced apart from one another, wherein the plurality of electrical connectors are in electrical communication with at least one of (i) ground and (ii) a potential sufficient to draw out stray charges in the light blocking layer.

In a more detailed embodiment of the first aspect, the three or more electrical connectors are arranged in a row along the edge of the light blocking layer. In yet another more detailed embodiment, the three or more electrical connectors are arranged in rows along the edge of the light blocking layer. In a further detailed embodiment, the three or more electrical connectors are arranged in rows along the edge of the light blocking layer in a staggered fashion. In still a further detailed embodiment, the three or more electrical connectors are in electrical communication with one another. In a more detailed embodiment the light blocking layer comprises the uppermost of a plurality of wiring layers formed above the signal processor. In a more detailed embodiment, the light blocking layer comprises an intermediate wiring layer of a plurality of wiring layers formed above the signal processor. In another more detailed embodiment, the three or more electrical connectors are laminated over the substrate. In yet another more detailed embodiment, at least one of the three or more electrical connectors comprises a contact plug. In still another more detailed embodiment, the contact plug comprises at least one of tungsten, copper, aluminum, molybdenum, and doped polysilicon.

In yet another more detailed embodiment of the first aspect, the light blocking layer comprises a wiring layer, and the contact plug is integrally formed with the wiring layer that comprises the light blocking layer. In still another more detailed embodiment, the contact plug and the wiring layer comprise at least one of tungsten, copper, molybdenum, and aluminum. In a further detailed embodiment, the substrate comprises a silicon-on-oxide substrate, and the light receiver and the signal processor are formed on a silicon layer of the silicon-on-oxide substrate. In still a further detailed embodiment, the silicon layer of the light receiver has a thickness operative to absorb ultraviolet light. In a more detailed embodiment, the thickness of the silicon layer is between about 3 nanometers to about 36 nanometers. In a more detailed embodiment, the substrate comprises a bulk substrate, and a filter is formed above the light receiver for transmitting only ultraviolet light. In another more detailed embodiment, the first aspect also includes a display unit that displays a representation correlating the presence of light incident on the light receiver, and a controller that controls the display unit and is in electrical communication with the signal processor.

It is a second aspect of the present invention to provide a semiconductor device comprising: (a) a light receiver formed on a light receiver portion of a substrate; (b) a signal processor formed on a signal processor portion of the substrate, the signal processor in electrical communication with the light receiver to receive an output signal from the light receiver; (c) a light blocking layer overlapping the signal processor to block light directly incident towards the signal processor portion of the substrate; and (d) a plurality of electrical connectors formed outside of an active area of the signal processor portion of the substrate, extending vertically with respect to the substrate, and blocking light obliquely incident on the signal processor portion of the substrate, wherein at least one of the plurality of electrical connectors is in electrical communication with at least one of (a) ground and (b) a potential sufficient to draw out stray charges in the light blocking layer.

In a more detailed embodiment of the second aspect, at least one of the plurality of electrical connectors interposes an active area of the signal processor and the light receiver portion of the substrate, and at least one of the plurality of electrical connectors extends between the substrate and the light blocking layer. In yet another more detailed embodiment, the plurality of electrical connectors are oriented in staggered rows.

It is a third aspect of the present invention to provide a method of manufacturing a semiconductor device including a light receiver and a light blocking layer formed on a substrate, and a signal processor receiving signals from the light receiver, comprising the steps of: (a) forming a plurality of first diffusing layers constituting the light receiver, forming sources and drains of a plurality of transistors constituting the signal processor, and forming a second diffusing layer fixed at a ground or a potential sufficient to draw out stray charges occurring in the light blocking layer on the substrate, where the forming steps occur concurrently; (b) forming electrical connectors in the first and second diffusing layers, and forming electrical connectors in electrical communication with at least one of the sources and the drains, where the forming steps occur concurrently; and (c) forming the light blocking layer to be in electrical communication with the second diffusing layer by way of the electrical connectors.

In a more detailed embodiment of the third aspect, a size of the electrical connectors formed in the light receiver is substantially the same as a size of the electrical connectors formed in the signal processor. In yet another more detailed embodiment, the second diffusing layer is formed approximate an edge of the signal processor. In a further detailed embodiment, the formation of the light blocking layer includes forming a wiring layer, and the plurality of electrical connectors formed in the second diffusing layer are in electrical communication with the wiring layer. In still a further detailed embodiment, the plurality of electrical connectors are arranged in a row along an edge of the light blocking layer.

In a more detailed embodiment, the plurality of electrical connectors are arranged in rows along an edge of the light blocking layer. In a more detailed embodiment, the plurality of electrical connectors are arranged in staggered rows along the edge of the light blocking layer. In another more detailed embodiment, the light blocking layer comprises the uppermost of a plurality of wiring layers formed above the signal processor. In yet another more detailed embodiment, the light blocking layer comprises an intermediate wiring layer of a plurality of wiring layers formed above the signal processor. In still another more detailed embodiment, at least one of the plurality of electrical connectors comprises a contact plug.

In yet another more detailed embodiment of the third aspect, the contact plug is fabricated from at least one of tungsten, copper, aluminum, molybdenum, and doped polysilicon. In still another more detailed embodiment, the substrate comprises a silicon-on-oxide substrate, and the light receiver and the signal processor are formed on a silicon layer of the silicon-on-oxide substrate. In a further detailed embodiment, the substrate comprises a bulk substrate, and a filter is formed above the light receiver allowing through transmission of only ultraviolet light.

BRIEF DESCRIPTION OF THE DRAWINGS

FIG. 4A is an overhead view of the semiconductor circuit of FIG. 4A, which shows the positional relationship between a light receiving element, a signal processing circuit and a contact plug.

DETAILED DESCRIPTION

The exemplary embodiments of the present invention are described and illustrated below to encompass semiconductor devices, optical measuring devices, optical detecting devices, and methods of manufacturing the foregoing to preventing unstable operation of a signal processing part from light incident thereon. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

Figure 1:
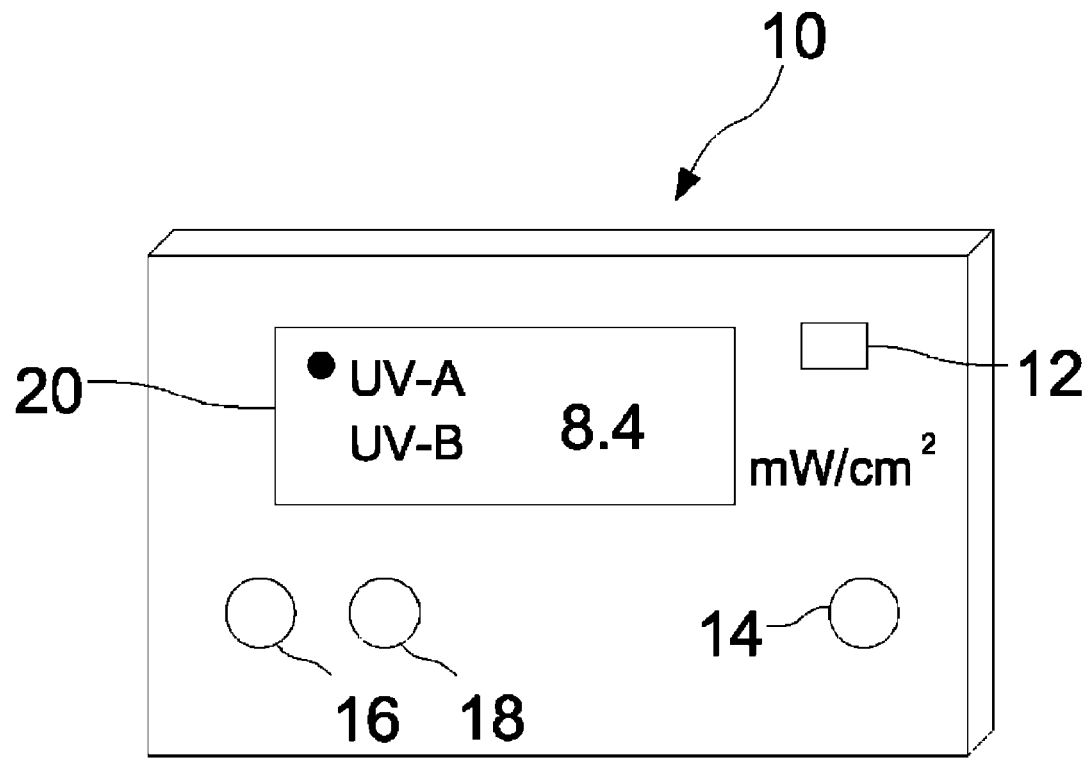
FIG. 1 is an elevated perspective view of an ultraviolet measuring device according to an embodiment of the present invention.

Referencing FIG. 1, an ultraviolet measuring device 10 in accordance with the present invention has a light-incident part 12. The light-incident part 12 receives ultraviolet light and outputs a signal based on the strength of the received ultraviolet light.

The ultraviolet measuring device 10 also has several operational buttons. The ultraviolet measuring device 10 is turned on and off by pushing a power button 14. By actuating a measurement button 16, the amount of ultraviolet light incident to the light-incident part 12 is measured. Measurement of the ultraviolet light is ended by actuating a stop button 18.

The measured amount or intensity of ultraviolet light is displayed on a liquid crystal display 20. The liquid crystal display 20 digitally displays the amount of UV-A ultraviolet light, the amount of UV-B ultraviolet light, and values of according to the UV Index.

Figure 2A:
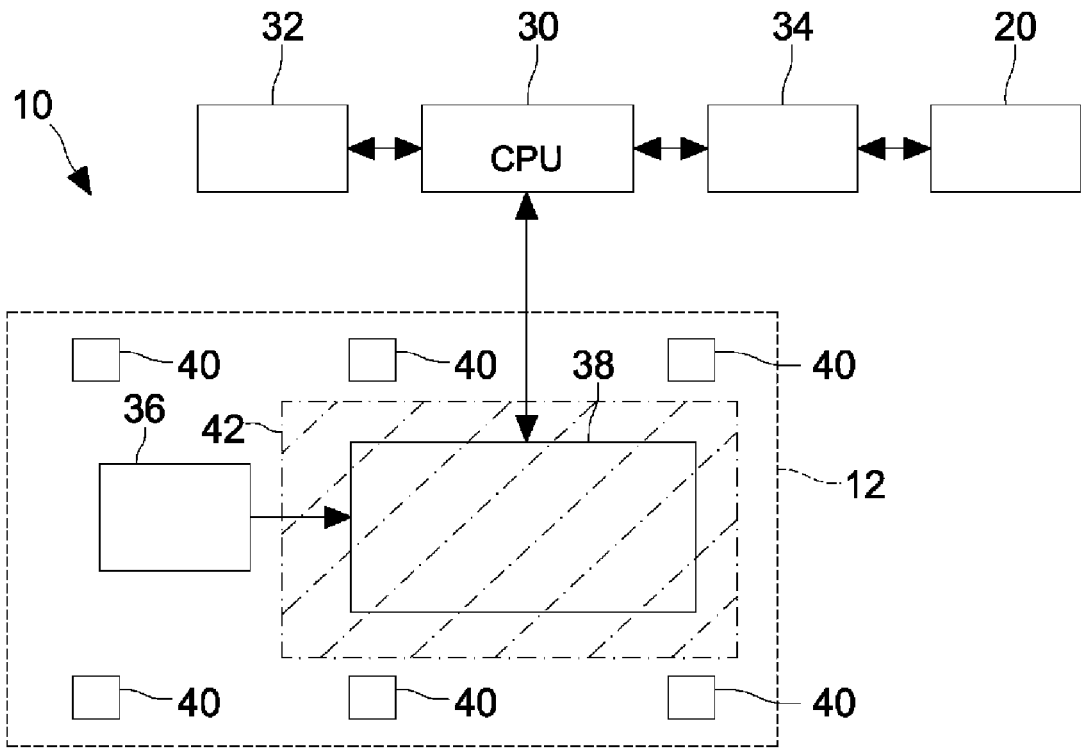
FIG. 2A is a combination overhead view and schematic diagram showing a main configuration of an electric system of an ultraviolet measuring device according to an embodiment of the present invention.

FIG. 2A shows an exemplary configuration of an electrical system of the ultraviolet measuring device 10. The ultraviolet measuring device 10 is configured to include a CPU 30, a memory 32, a display driver 34, and the liquid crystal display 20 in addition to the light-incident part 12.

Figure 2B:
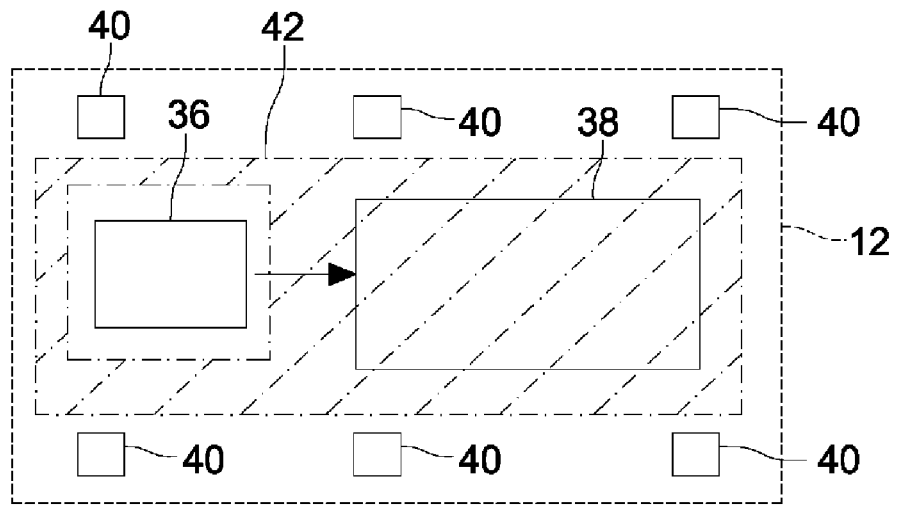
FIG. 2B is an overhead view of an alternate light incident part of an ultraviolet measuring device according to an embodiment of the present invention.

The light-incident part 12 is formed on a silicon-on-insulator (SOI) substrate and is provided with a light receiving element 36, a signal processing circuit 38 and signal input/output pads 40. A light blocking layer 42 (the cross-hatched portion surrounded by a dashed dotted line in FIG. 2A) is provided above the signal processing circuit 38. Alternatively, as shown in FIG. 2B, the light blocking layer 42 may be formed in regions other than over the signal processing circuit 38 in order to block light over a wider range than that covered by the light blocking layer 42 shown in FIG. 2A.

The light receiving element 36 generates a photoelectric current depending on the amount of received ultraviolet light and outputs the generated photoelectric current to the signal processing circuit 38. The signal processing circuit 38 converts the photoelectric current into a voltage, amplifies the voltage, and then converts the amplified voltage into a digital signal, which can be processed by the CPU 30 by means of an analog-to-digital converter (ADC). Signals or power to operate the light receiving element 36 and the signal processing circuit 38 is supplied from the signal input/output pads 40.

The CPU 30 controls the entire operation of the ultraviolet light measuring device 10, calculates the amount of ultraviolet light from the digital signal using a predetermined calculation equation, and stores data concerning the amount ultraviolet light detected in the memory 32.

The display driver 34 performs a predetermined process so that the ultraviolet light amount data stored in the memory 32 can be displayed on the liquid crystal display 20, and displays the amount of ultraviolet light incident to the light-incident part 12 on the liquid crystal display 20 through a large scale integration (LSI) of a display circuit for displaying numerical values and dots to optionally generate pictures.

In addition, it is also within the scope of the invention that the light-incident part 12, the CPU 30, the memory 32, and the display driver 34 are all incorporated into a single chip.

Figure 3A:
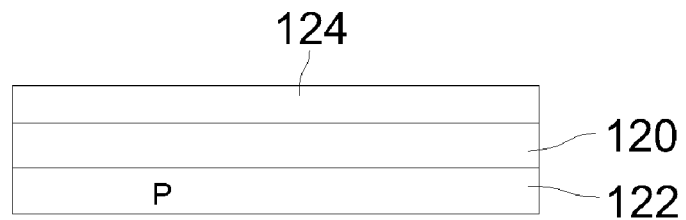
FIGS. 3A-3G are representative cross-sectional views showing stages of manufacturing the semiconductor circuit of the present invention.

Referencing FIG. 3A, a manufacturing sequence for the light-incident part 12 includes forming an embedded oxide layer 120 on a P type silicon (Si) substrate 122 as a SOI substrate, and forming a thin silicon layer 124 on the P type Si substrate. The light receiving element 36 is formed on the thin silicon layer 124 of the SOI substrate 122. The thickness of the thin silicon layer 124 on which the light receiving element 36 is formed is set so as to absorb ultraviolet light and transmit visible light, so that the light receiving element 36 is sensitive to the ultraviolet light.

Figure 3B:
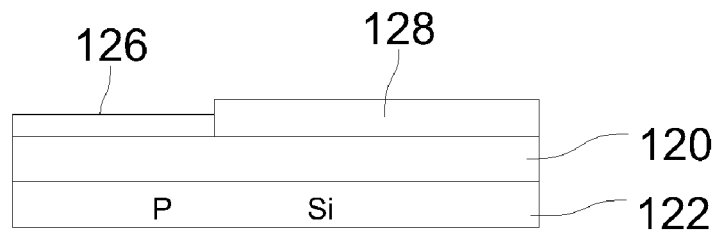

Referring to FIG. 3B, a portion of the thin silicon layer 124 is etched using existing photolithography and etching methods to form a first thin silicon layer 126, while the remainder of the silicon layer not etched is identified as the second thin silicon layer 128. The light receiving element 36 is formed on a first thin silicon layer 126 and the signal processing circuit 38 is formed on a second thin silicon layer 128. For example, the thickness of the first thin silicon layer 126 is 3 nanometers to 36 nanometers. As discussed previously, the light receiving element 36 absorbs the ultraviolet light and transmits the visible light. Alternatively, the etching step may be skipped if the thicknesses of the layers 126, 128 are within predetermined tolerances.

Figure 3C:
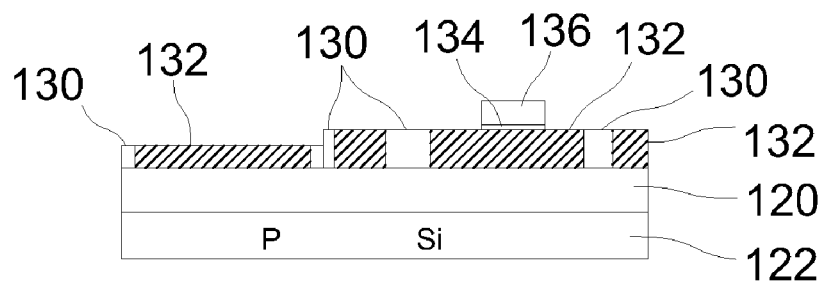

Referencing FIG. 3C, an oxidation process is performed to form a field oxide region 130 to isolate an element region from other regions. Thereafter, an implantation process is performed for portions in which the light receiving element 36 and the signal processing circuit 38 are formed, thereby forming a lightly-doped diffusing layer (lightly-doped P− type diffusing layer) 132, and then, a gate oxide layer 134 and a gate electrode 136 are formed thereon (FIG. 3C). Although the lightly-doped P− type diffusing layer is identified in FIG. 3C, it should be noted that both implantation processes of N type (N−) and P type (P−) are performed for a lightly-doped diffusing layer in this exemplary process.

Figure 3D:
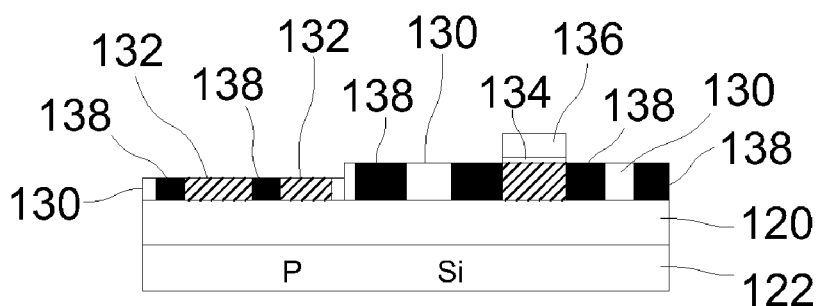
Figure 3E:
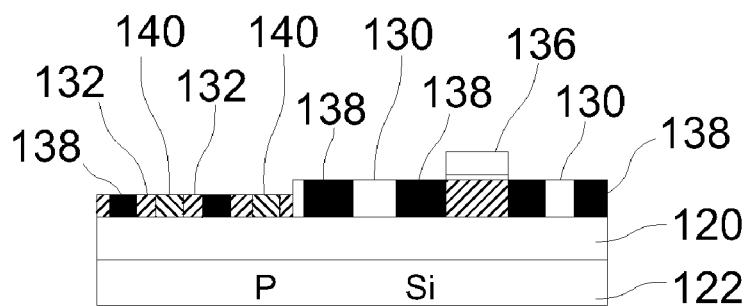

Referring to FIG. 3D, a heavily-doped N+ type diffusing layer 138 is formed. The heavily-doped N+ type diffusing layer 138 is formed by diffusing relatively dense N type impurities such as phosphorus (P), arsenic (As), or the like into the silicon thin layer. Subsequently, in FIG. 3E, a heavily-doped P+ type diffusing layer 140 is formed. The heavily-doped P+ type diffusing layer is formed by diffusing relatively dense P type impurities such as boron (B) or the like into the silicon thin layer.

The light receiving element 36 is formed to have a structure where a diffusing layer 132 (lightly-doped P− type diffusing layer or a lightly-doped N− type diffusing layer) having an implantation concentration lower than that of the heavily-doped N+ type diffusing layer 138 and the heavily-doped P+ type diffusing layer 140 is arranged to contact the heavily-doped N+ type diffusing layer 138 on one side of a horizontal direction and contact the heavily-doped P+ type diffusing layer 140 on the other side of the horizontal direction (lateral diode).

Figure 3F:
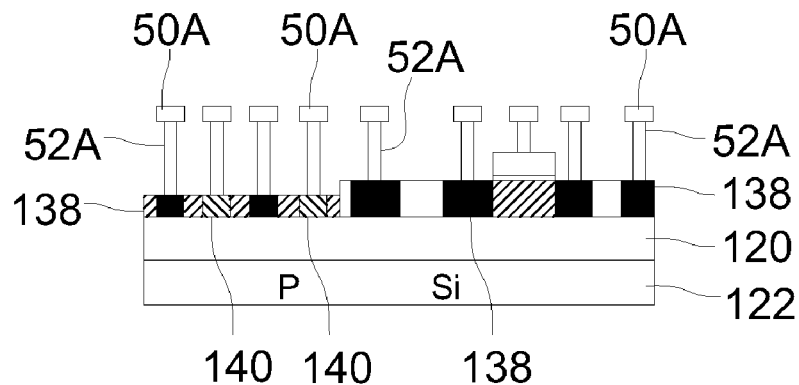

Referencing FIG. 3F, after an interlayer film (not shown) is formed, a first wiring layer 50A and a series of first contact plugs 52A are formed. The first contact plugs 52A are formed by forming contact holes in the interlayer film, depositing a conductive material using a sputtering method or a CVD (Chemical Vapor Deposition) method so that the contact hole is filled with the conductive material. The first contact plugs 52A electrically connect the heavily-doped P+ type diffusing layer 140 and the heavily-doped N+ type diffusing layer 138 to the first wiring layer 50A. An example of the conductive material suitable for forming the contact plugs 52A includes, without limitation, tungsten (W), copper (Cu), aluminum (Al), molybdenum (Mo), titanium (Ti), doped polysilicon, and alloys of the foregoing metals.

An etching process is carried out to remove the conductive material deposited on the interlayer film (not shown) as part of the contact hole filling process, while at the same time retaining the conductive material within the contact holes. Thereafter, the first wiring layer 50A is formed on the interlayer film.

Figure 3G:
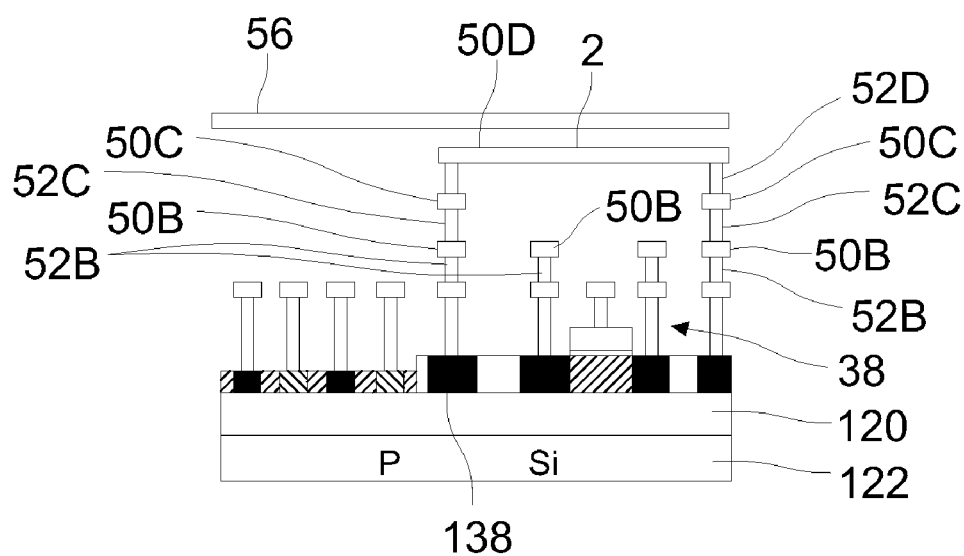

Referring to FIG. 3G, after the first wiring layer 50A is formed, an interlayer film (not shown) is formed, and then a second set of contact plugs 52B and a second wiring layer 50B are formed in the same as the process of forming the first contact plugs 52A and the first wiring layer 50A. In addition, after the second wiring layer 50B is formed, an interlayer film (not shown) is formed, and then a third set of contact plugs 52C and a third wiring layer 50C are formed.

Additionally, after the first wiring layer 50A is formed, an interlayer film (not shown) is formed, and then a fourth set of contact plugs 52D and a fourth wiring layer 50D are formed to function as a light blocking layer 42. The fourth wiring layer 50D is formed of a metal layer in order to block the sunlight incident directly overhead the signal processing circuit 38. An interlayer film (not shown) is additionally formed on the fourth wiring layer 50D and thereafter an ultraviolet transmission protection layer 56 is formed on the interlayer film. It should be noted that the ultraviolet transmission protection layer 56 allows transmission of ultraviolet light therethrough.

In order to increase the light blocking property for sunlight obliquely incident on the signal processing circuit 38, the first contact plug 52A, the second contact plug 52B and the third contact plug 52C are arranged to surround the signal processing circuit 38. Hereafter, the first contact plug 52A, the second contact plug 52B, the third contact plug 52C, and the fourth contact plug 52D, are collectively referred to as contact plug 52 for purposes of brevity. Similarly, the first wiring layer 50A, the second wiring layer 50B, the third wiring layer 50C, and the fourth wiring layer 50D, may be hereafter collectively referred to as wiring layer 50 for purposes of brevity. For purposes of this disclosure, vertically extending electrical connecting members is any combination of one or more wiring layers 50 and one or more contact plugs 52.

The contact plug 52 is provided to electrically connect the fourth wiring layer 50D to a heavily-doped diffusing layer 138. As shown in FIG. 3G, the fourth wiring layer SOD is connected to the contact plug 52, which is connected to the heavily-doped N+ type diffusing layer 138. If a potential level of the heavily-doped N+ type diffusing layer 138 connected with the contact plug 52 is a ground level, a potential level of the fourth wiring layer 50D becomes a ground level through the contact plug 52. In addition, if the potential level of the heavily-doped N+ type diffusing layer 138 connected with the contact plug 52 is a potential level at which stray charges occurring in the fourth wiring layer 50D can be drawn out, the potential level of the fourth wiring layer 50D becomes a potential level at which stray charges occurring in the fourth wiring layer can be drawn out through the contact plug 52. The potential level at which stray charges occurring in the fourth wiring layer can be drawn out may be randomly set by a power source (not shown).

In addition, although the conductive material formed on the interlayer film when the contact plug 52 is removed by the etching method in the foregoing exemplary manufacturing process, the conductive material may be formed on the interlayer film with an amount sufficient to form the wiring layer 50 so that the conductive material itself may be used as the wiring layer 50 without being etched out. By doing so, the contact plug 52 and the wiring layer 50 can be formed at the same time, accordingly saving time by omitting the intervening etching step after contact plug formation.

Figure 4A:
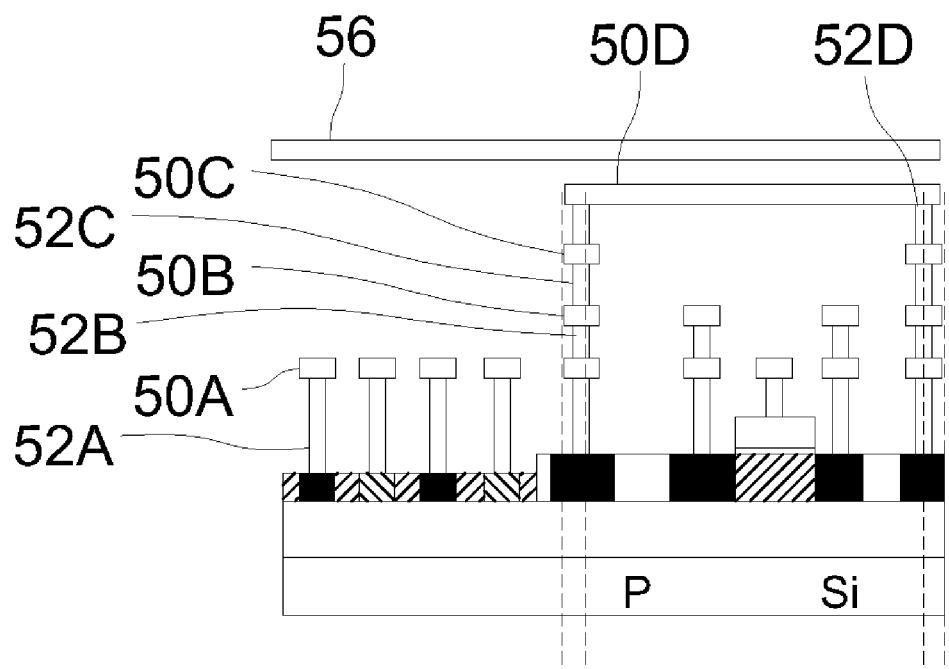
FIG. 4A is a representative cross-section of a completed semiconductor circuit in accordance with the present invention.
Figure 4A:
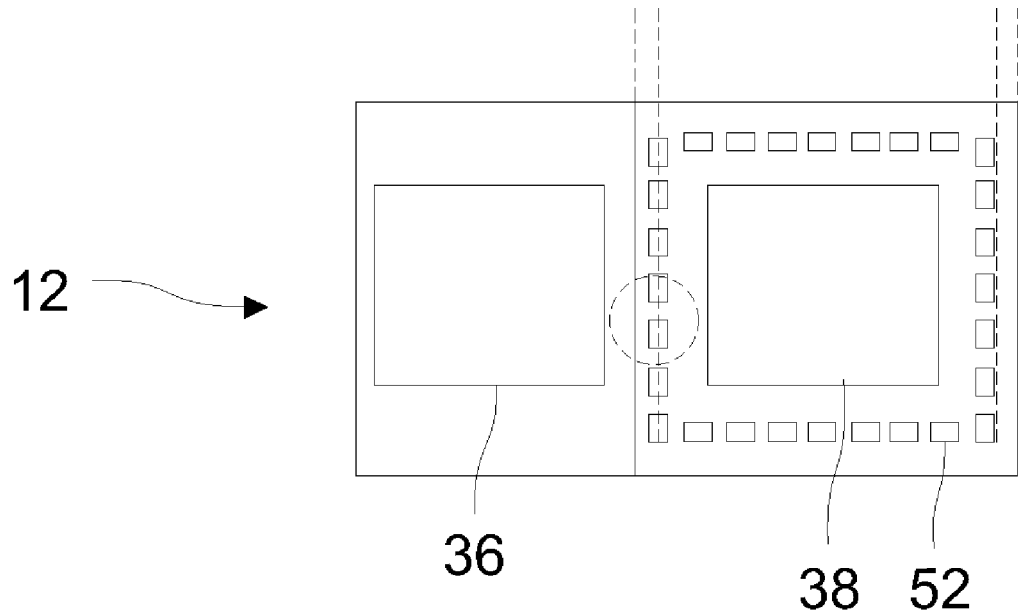

Referencing FIGS. 4A and 4A', a positional relationship is shown between the light receiving element 36, the signal processing circuit 38 and the contact plugs 52. FIG. 4A is a sectional view of the light-incident part 12 and FIG. 4A' is an overhead view showing an arrangement of the contact plugs 52. The contact plugs 52 are arranged to surround the signal processing circuit 38. In addition, the contact plugs 52 are arranged so that they do not intercept wirings interconnecting the light receiving element 36 and the signal processing circuit 38.

Figure 4B:
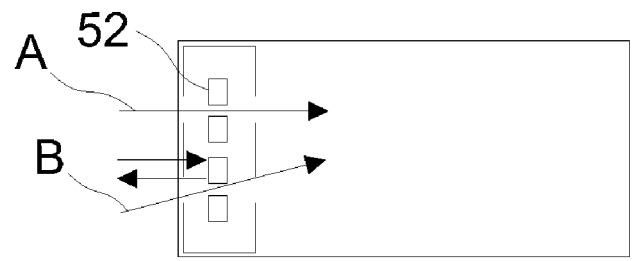
FIGS. 4B-4D are overhead views of exemplary arrangements of contact plugs and underlying wiring layers (not shown) that cooperate to provide a light barrier for light not otherwise blocked by the horizontal light blocking layer.
Figure 4C:
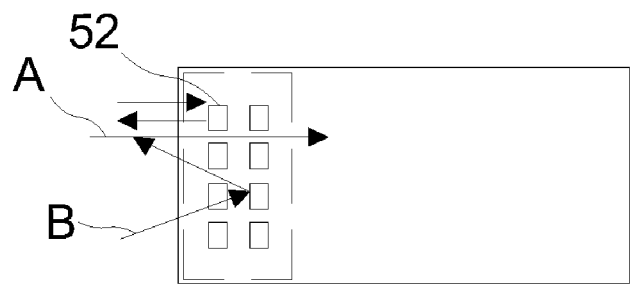
Figure 4D:
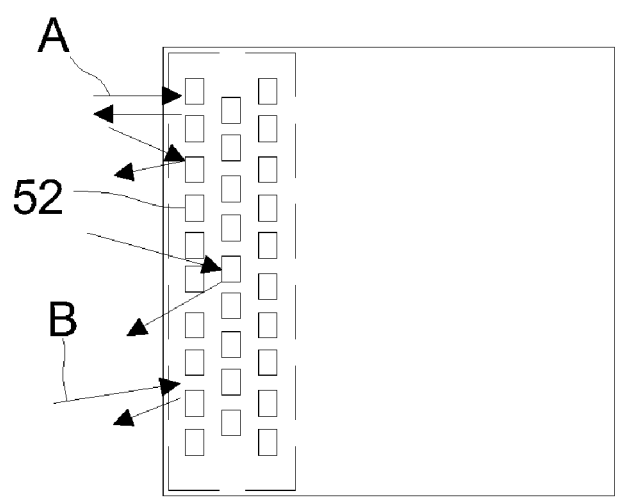

FIGS. 4B-4D show exemplary overhead views of segments of vertically extending electrical connecting members 50, 52 oriented in various fashions between the light receiving element 36 and the signal processing circuit 38 shown in FIGS. 4A and 4A'.

Referring specifically to FIG. 4B, the contact plugs 52 are arranged in a single row. In this case, some of the sunlight incident to the rows, as denoted by arrows A and B in FIG. 4B, reaches the signal processing circuit 38 without being blocked. Although the light-incident part 12 can be decreased in size if the distance between the contact plug 52 and the signal processing circuit 38 is set to be relatively small, the signal processing circuit 38 is nevertheless adversely affected by light that cannot be blocked by the contact plugs 52. To account for this situation, the contact plugs 52 are arranged in multiple tows to further decrease the concentration of light reaching the signal processing circuit 38. FIG. 4C shows an arrangement of contact plugs 52 in two rows. This arrangement allows the light, which is incident at an angle as denoted by arrow B, to be more readily blocked than the arrangement of the contact plugs 52 shown in FIG. 4B. Finally, FIG. 4D shows an arrangement of contact plugs 52 in three rows organized in a staggered fashion along an edge of the light blocking layer. This arrangement allows the light, which is incident as denoted by arrows A and B, to be more readily blocked in comparison to the plug orientations shown in FIGS. 4B and 4C. It is to be understood that the instant invention is not limited to the foregoing contact plug orientations and that other orientations that are operative to block light from reaching the signal processing circuit also fall within the scope of the present invention.

Although the wiring layers 50 and the contact plugs 52 play a role in blocking light as shown in FIGS. 4A-4D and may act as parasitic capacitance with regard to the light receiving element 36 and the signal processing circuit 38, these layers 50 and plugs 52 have no effect on delay of signal processing. In addition, assuming that the diameter (or one side in case of a square) of the contact plugs 52 is D and the minimum interval between the contact plugs 52 is S, it is preferable that D is larger than S.

As described above, the light-incident part 12 includes the light receiving element 36 and the signal processing circuit 38 that processes an output signal from the light receiving element 36, which are formed on the SOI substrate. The plurality of contact plugs 52 connected to the light blocking layer 42 are laminated on top of one another along the edge of the light blocking layer, with the uppermost wiring layer on the signal processing circuit 38 comprising the light blocking layer 42. Accordingly, the light, which was not blocked by the light blocking layer 42, is blocked and thereby precludes unstable operation of the signal processing circuit 38.

In addition, the light blocking layer 42 is electrically connected (i.e., electrical communication) to the contact plugs 52. Accordingly, the light blocking layer 42 may have a ground level or any potential level at which stray charges occurring in the light blocking layer 42 are drawn out through the contact plugs 52, so that the stray charges occurring in the light blocking layer 42 escape therefrom. As a result, the stray charges do not pool in the light blocking layer 42 and, accordingly, have no effect on the signal processing circuit 38. Moreover, since the contact plugs 52 are formed during formation of the light receiving element 36 and the signal processing circuit 38, the light blocking layer 42 can be simply and easily formed using conventional forming processes.

Figure 5:
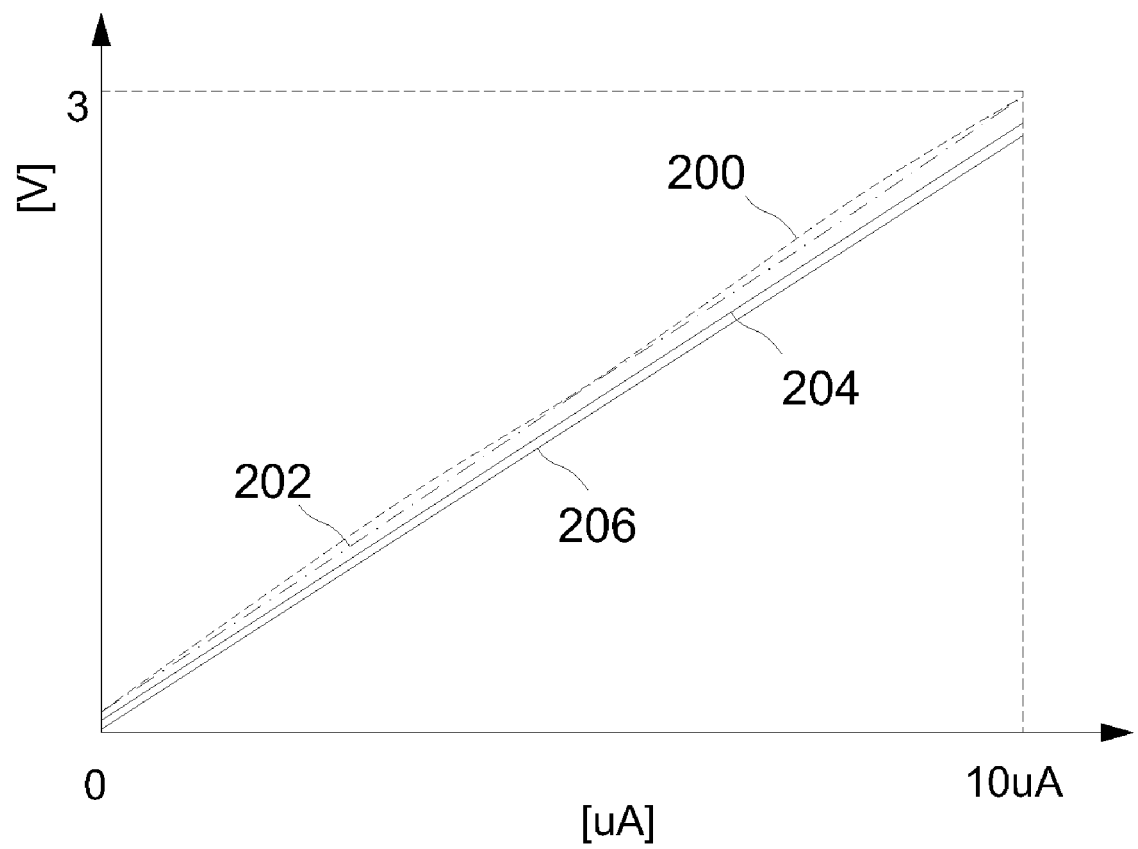
FIG. 5 is an exemplary graph showing a relationship between an actual measuring value of a voltage into which an output signal from a light receiving element is converted by a signal processing circuit having a light blocking member, and a photoelectric current indicating a strength of ultraviolet light incident on the light receiving element according to an embodiment of the present invention.
Figure 10:
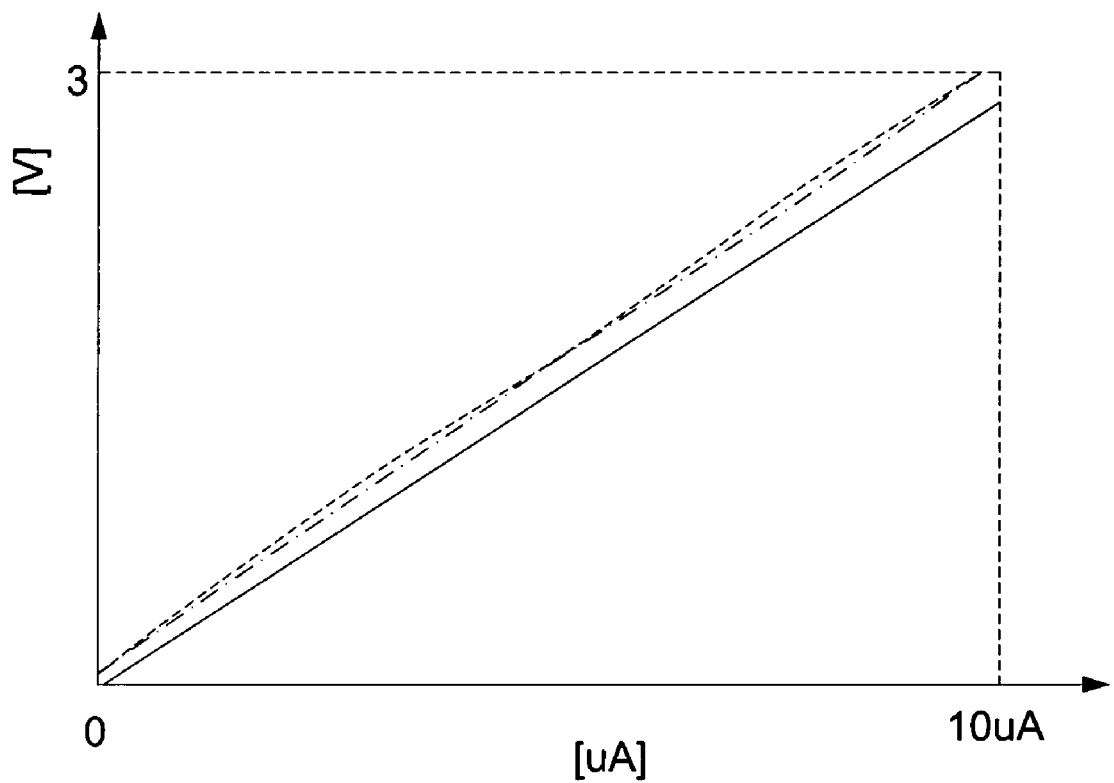
FIG. 10 is an exemplary graph showing the relationship between an actual measuring value of a voltage into which an output signal from a light receiving element is converted by a signal processing circuit, and a photoelectric current indicating a strength of ultraviolet light incident on the light receiving element.

Referring to FIG. 5, a graph shows the relationship between an actual measuring value of a voltage into which an output signal from the light receiving element 36 is converted by the signal processing circuit 38, and a photoelectric current indicating the strength of ultraviolet light incident on the light receiving element 36. Actual measurement values without a light blocking member for two different examples 200, 202 are shown in FIG. 5, which deviate from a design value as described above with reference to FIG. 10. However, an actual measurement value with a light blocking member 204 has a much smaller deviation from the design value 206 than the measurement values for the two examples without a light blocking member. A relationship between the photoelectric current outputted from the light receiving element 36 and the voltage value after the conversion in the signal processing circuit 38 has linearity to confirm the light blocking effect by the light blocking member.

Although it has been illustrated in the above exemplary embodiments that the contact plugs 52 are connected to the fourth wiring layer 50D, acting as the light blocking layer 42, which is connected to the heavily-doped N+ type diffusing layer 138 whose potential level is a ground level or a potential level at which stray charges occurring in the fourth wiring layer 50D can be drawn out, it is also within the scope of the invention to draw away straw charges occurring in the light blocking layer 42 using different connecting structures.

Figure 6A:
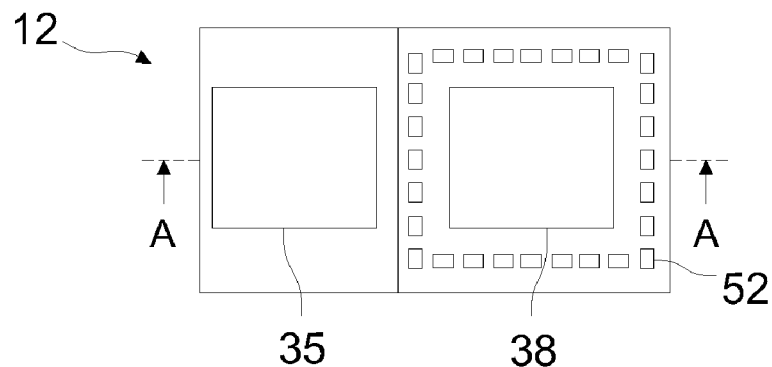
FIG. 6A is an overhead view of an exemplary semiconductor circuit formed in accordance with the instant invention.
Figure 6B:
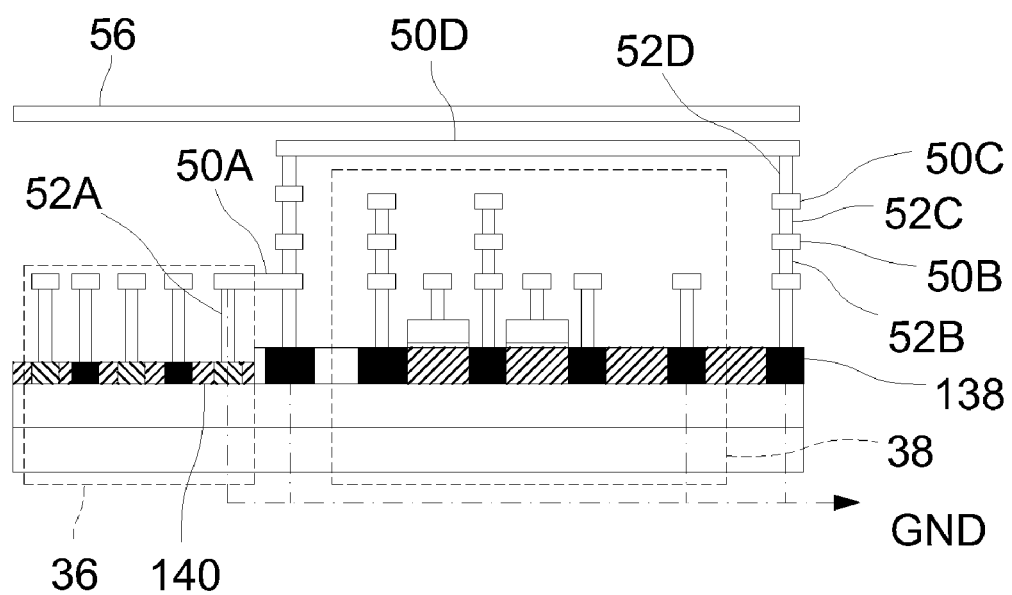
FIGS. 6B-6D are representative cross-sectional views showing alternative configurations for electrically connecting a light blocking layer to a ground level or any potential level from which stray charges can be drawn out according to the present invention.
Figure 6C:
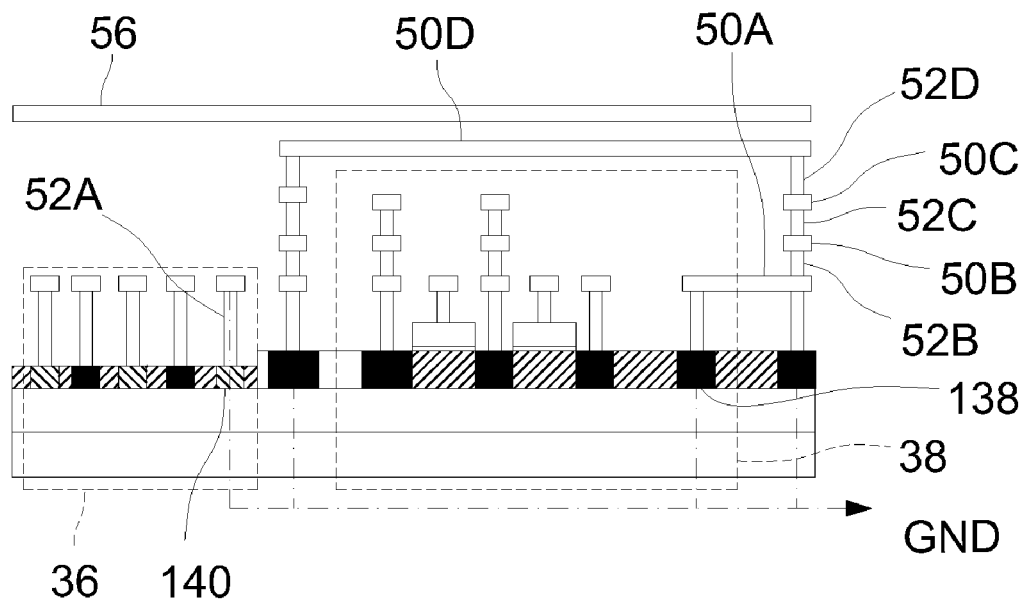
Figure 6D:
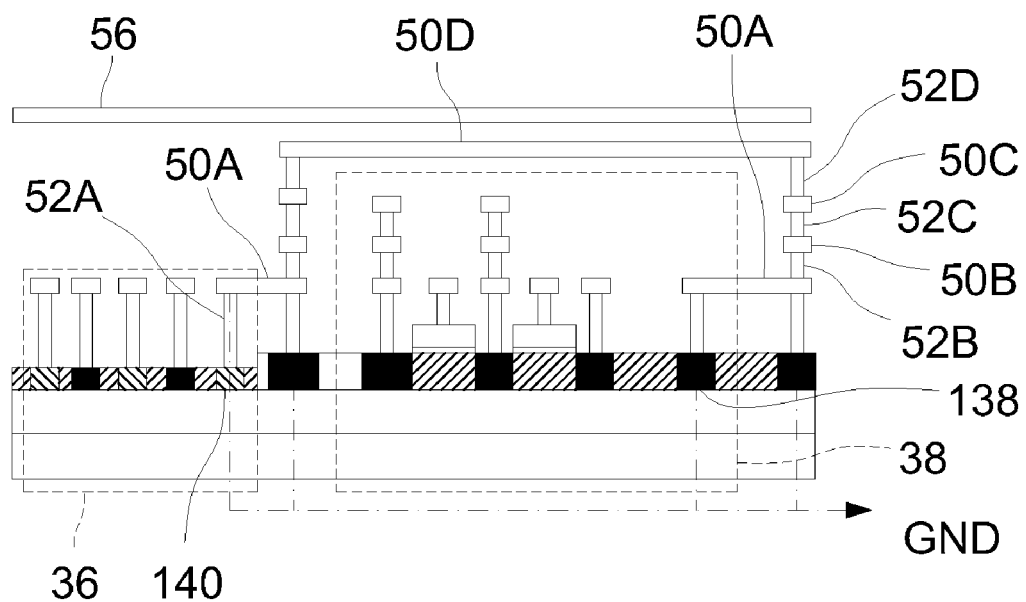

Referencing FIGS. 6A-6D, an exemplary modification to the semiconductor circuit is shown in order to draw away stray charges from wiring layer 50D to a ground level or a potential level. Specifically, FIGS. 6B-6D are sectional views of the light-incident part 12 shown in FIG. 6A, which are taken along line A-A in FIG. 6A. FIGS. 6B-6D show that the potential level of the fourth wiring layer 50D may be the ground (GND) level or the potential level at which stray charges occurring in the fourth wiring layer 50D can be drawn out through different connecting methods.

As shown in FIG. 6B, the contact plugs 52 connected to the fourth wiring layer 50D are electrically connected to the heavily-doped N+ type diffusing layer 138 whose potential level is a ground level or a potential level at which stray charges occurring in the fourth wiring layer 50D can be drawn out. The fourth wiring layer 50D is also connected to the first contact plug 52A of the light receiving element 36 through the first wiring layer 50A. The first contact plugs 52A of the light receiving element 36 are electrically connected to the heavily-doped P+ type diffusing layer 140. A potential level of the heavily-doped P+ type diffusing layer 140 becomes the ground level or the potential level at which stray charges occurring in the fourth wiring layer 50D can be drawn out.

FIG. 6C shows a case where the contact plugs 52 (on the left side) and the fourth wiring layer 50D are electrically connected to a heavily-doped N+ type diffusing layer 138 inside of the signal processing circuit that is not a ground level or a potential level at which stray charges occurring in the fourth wiring layer 50D can be drawn out. In this case, the contact plugs 52 (on the right side) are connected to the first contact plug 52A in the signal processing circuit 38 through the first wiring layer 50A. The contact plugs 52A in the signal processing circuit 38 are connected to the heavily-doped N+ type diffusing layer 138 or the heavily-doped P+ type diffusing layer 140 whose potential level is a ground level or a potential level at which stray charges occurring in the fourth wiring layer 50D can be drawn out (connected to the heavily-doped N+ type diffusing layer 138). Accordingly, it is possible to draw out stray charges occurring in the fourth wiring layer 50D even when some of the contact plugs 52 are not directly connected to a diffusing layer whose potential level is a ground level or a potential level at which stray charges can be drawn out.

As shown in FIG. 6D, some of the contact plugs 52 connected to the fourth wiring layer 50D are connected to the heavily-doped N+ type diffusing layer 138 within the signal processing circuit 38 whose potential level is a ground level or a potential level at which stray charges occurring in the fourth wiring layer SOD can be drawn out, while other contact plugs 52 are connected to the heavily-doped P+ type diffusing layer 140 by way of the first wiring layer 50B extending into the light receiving element 36.

The above exemplary embodiments have been described with configurations where the number of wiring layers 50 is four, the fourth wiring layer 50D is taken as the light blocking layer 42, and the third wiring layer 50C and below are taken as signal lines, but, without being limited to this, the uppermost of a plurality of wiring layers 50 may be used as the light blocking layer 42. As one example, if the number of wiring layers 50 is five and a fifth wiring layer is used as the light blocking layer 42, the fourth wiring layer 50D and below are used as signal lines. As another example, if the number of wiring layers 50 is three and the third wiring layer is used as the light blocking layer 42, the second wiring layer 50B and below are used as signal lines.

Figure 7A:
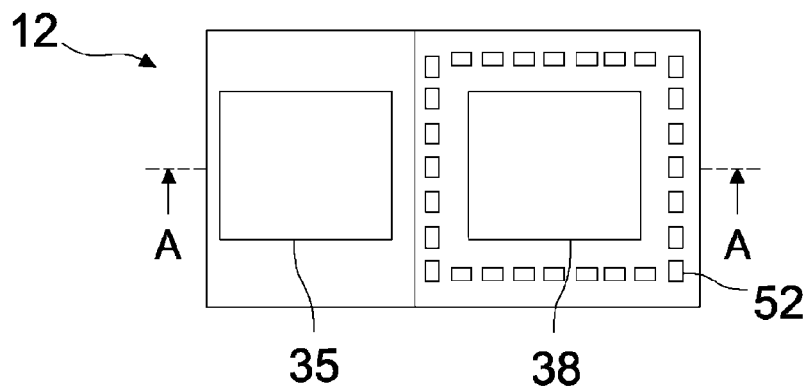
FIG. 7A is an overhead view of an exemplary semiconductor circuit formed in accordance with the instant invention.
Figure 7B:
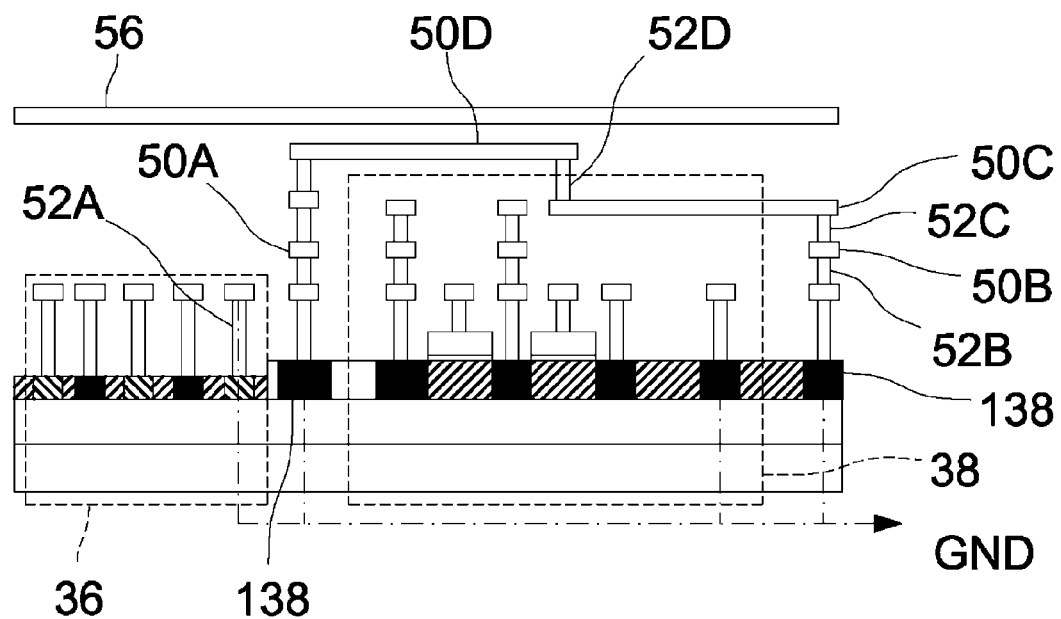
FIGS. 7B and 7C are representative cross-sectional views showing alternative configurations for using multiple wiring layers as the light blocking layer according to the present invention.
Figure 7C:
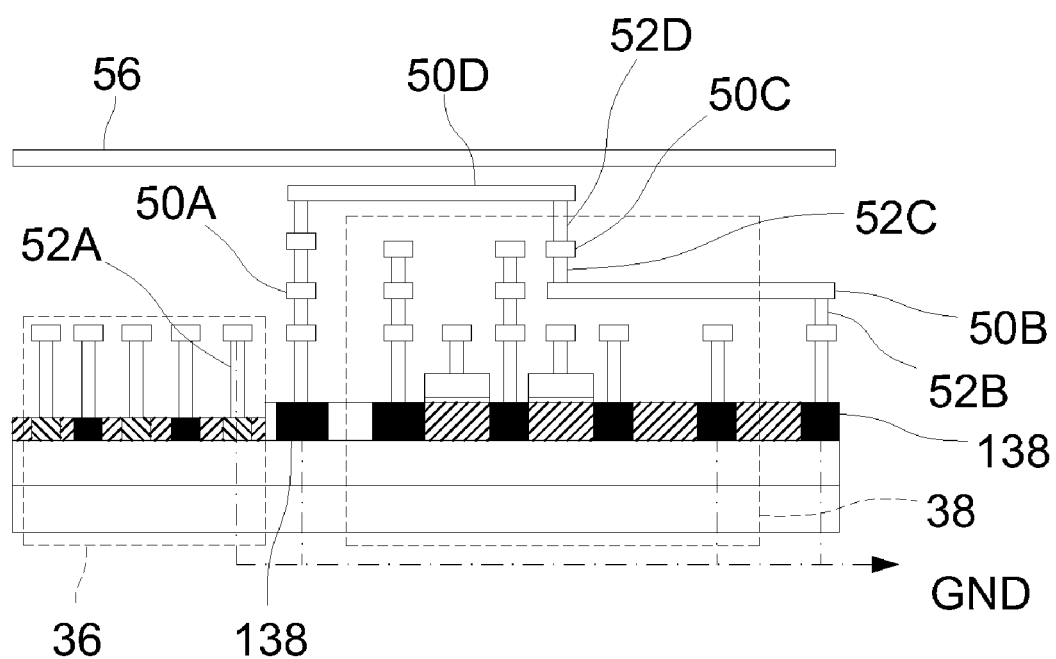
Figure 8A:
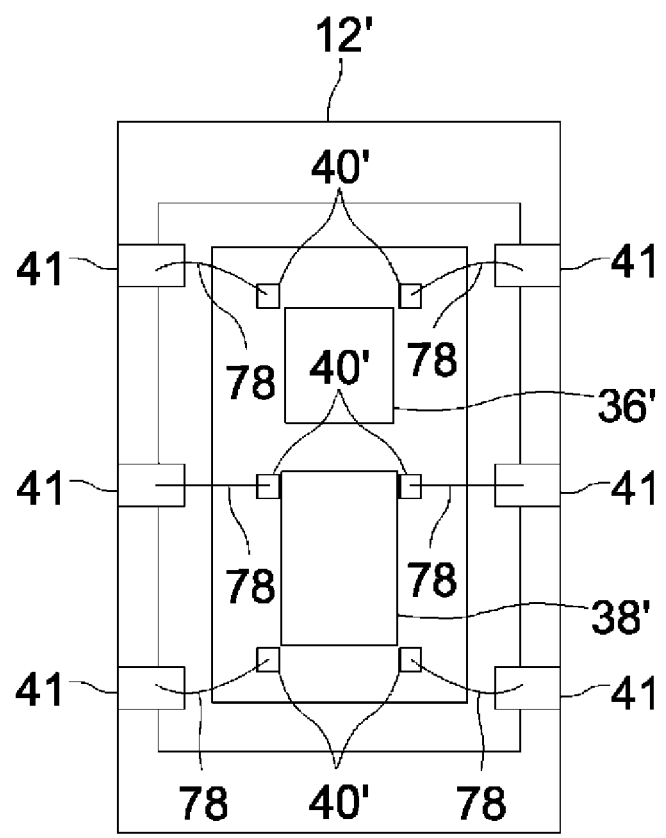
FIG. 8A is an overhead view of a semiconductor circuit having a light receiving element and a signal processing circuit in accordance with the instant invention.
Figure 8B:
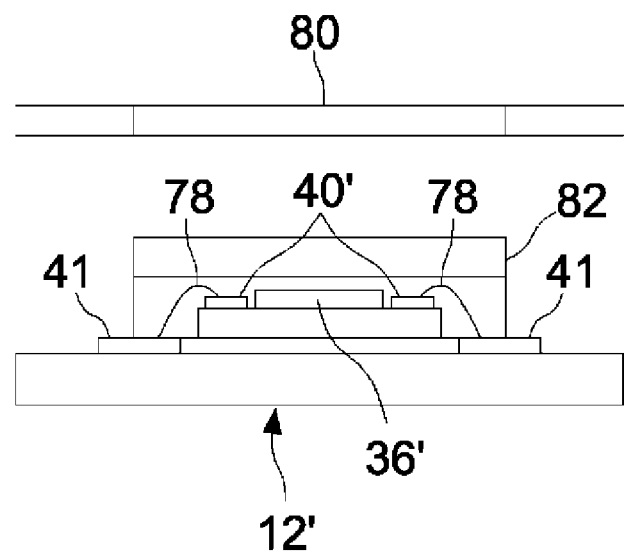
FIG. 8B is an representative cross-sectional view of the semiconductor circuit of FIG. 8A.
Figure 9A:
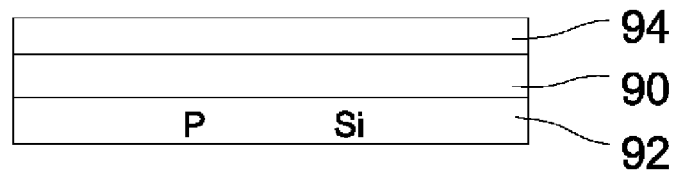
FIGS. 9A-9G are staged representative cross-sectional views of a prior art manufacturing process.
Figure 9B:
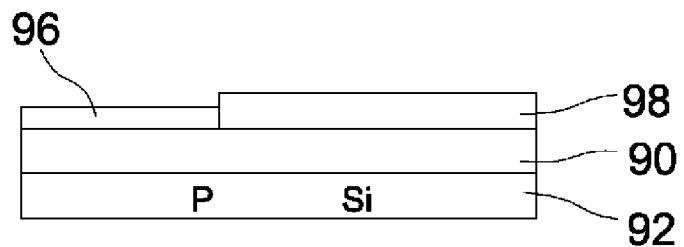
Figure 9C:
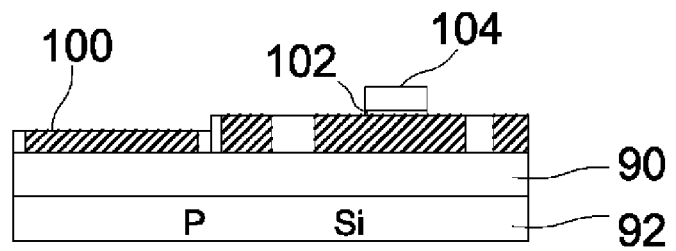
Figure 9D:
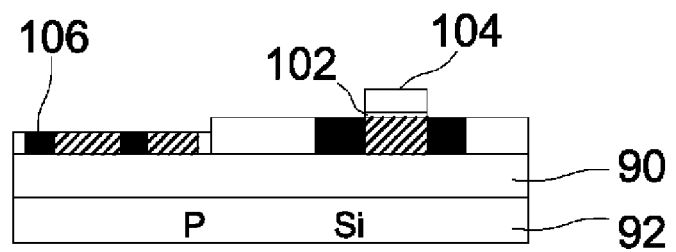
Figure 9E:
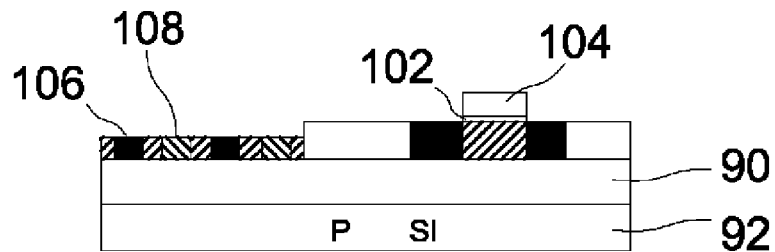
Figure 9F:
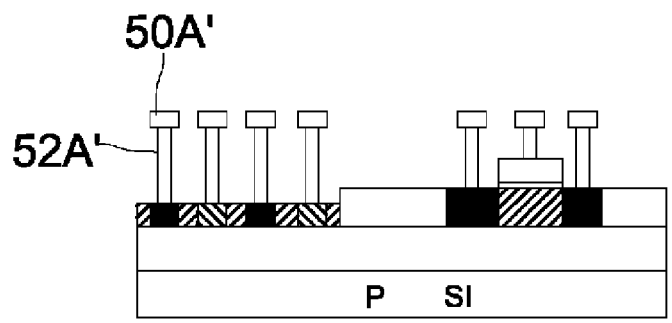
Figure 9G:
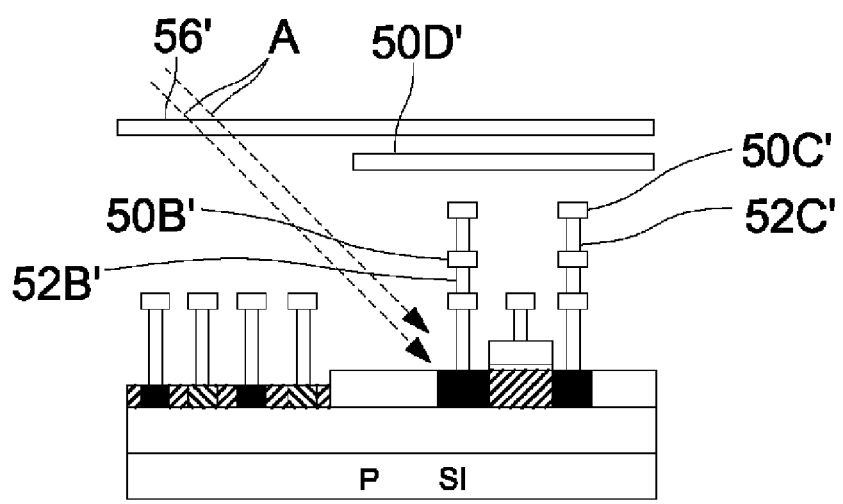

Referring to FIGS. 7A-7C, an exemplary modification is shown in which the number of wiring layers is four. In this exemplary embodiment, both the fourth wiring layer and intervening wiring layers (second wiring layer in FIG. 7C, and third wiring layer in FIG. 7B) are utilized to form the light blocking layer 42.

As shown in FIG. 7B, the third wiring layer 50C and the fourth wiring layer 50D cooperate to form the light blocking layer 42. In this case, when a plurality of fourth contact plugs 52D are arranged along the edge of the light blocking layer 42, as shown in FIGS. 4B-4D, between the fourth wiring layer 40D as the light blocking layer 42 and the third wiring layer 50C, the light incident on the signal processing circuit 38 is blocked.

In addition, as shown in FIG. 7C, the second wiring layer 50B cooperates with the fourth wiring layer 50D to form the light blocking layer 42. In this case, when a plurality of third contact plugs 52C and fourth contact plugs 52D are arranged, as shown in FIGS. 4B-4D, between the fourth wiring layer 40D as the light blocking layer 42 and the second wiring layer 50B, the light incident on the signal processing circuit 38 is blocked.

In addition, in FIGS. 7B and 7C, although not particularly shown, the contact plugs 52, connected to each wiring layer comprising the light blocking layer 42, are also electrically connected to the heavily-doped N+ type diffusing layer 138 whose potential level is a ground level or a potential level at which stray charges occurring in the light blocking layer 42 can be drawn out. However, it should also be understood that the electrical connection shown in FIGS. 6B-6D could likewise be used in lieu of the configuration shown in FIGS. 7B and 7C for drawing out stray charges occurring in the light blocking layer 42.

In addition, although layer 42 is used as the light blocking layer in the above embodiments, it is also within the scope of the invention to fabricate the light blocking layer 42 from signal lines and a metal layer not in electrical communication with the signal lines. In addition, it is also within the scope of the invention to include signal lines that are not in contact with the light blocking layer 42. This is in contrast to those signal lines connected to a ground level or any potential level at which stray charges occurring in the light blocking layer 42 can be drawn out.

It is further within the scope of the invention that a portion of the uppermost light blocking layer 42 may be reconfigured by making openings therethrough using a laser, for example. In this case, in order to prevent the signal processing circuit 38 from being affected by the light obliquely incident through such an opening(s), the light is blocked using intervening wiring layers 50 and the contact plugs 52.

In addition, although the ultraviolet transmission protection layer 56 is arranged in the light-incident part 12 in the above exemplary embodiments, it is also within the scope of the invention to provide the ultraviolet transmission protection layer 56 outside of the light-incident part 12.

In addition, although the above exemplary embodiments have been explained using an SOI substrate, it is also within the scope of the invention to use a silicon-on-sapphire (SOS) structure. Alternatively, it is also within the scope of the invention to utilize a silicon-on-quartz (SOQ) substrate in lieu of an SOI substrate. In addition, the substrate on which the light-incident part 12 is formed may be a bulk substrate formed of single crystal silicon. In this case, since the light receiving element 36 formed on the bulk substrate has a sensitivity to visible light in addition to ultraviolet light, a filter for blocking the light other than the ultraviolet light may be arranged above the light receiving element 36. In addition, the light blocking layer 42 and a light blocking member for the signal processing circuit 38 may be arranged to prevent the ultraviolet light, some of the visible light and infrared light which pass through the filter, from being incident on the signal processing circuit 38.

Although the light-incident part 12 is used for the ultraviolet measuring device 10 to measure the amount of ultraviolet light incident on the light receiving element 36 in the above exemplary embodiments, it is also within the scope of the invention to use the light-incident part 12 as an ultraviolet detecting device. The ultraviolet detecting device detects incidence of ultraviolet light on the light receiving element 36 and displays a result of the detection on a display, such as display 20. More specifically, based on a signal that is output from the light receiving element 36, on which the ultraviolet light is incident and that is processed by the signal processing circuit 38, a control part controls the display to display whether or not there is ultraviolet light detected.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A semiconductor device comprising:
   a light receiver formed on a substrate;
   a signal processor formed on the substrate, the signal processor, in electrical communication with the light receiver to receive an output signal from the light receiver;
   a light blocking layer overlapping the signal processor; and
   three or more, electrical connectors interposing the light blocking layer and the substrate, where at least two of the plurality of electrical connectors are spaced apart from one another,
   wherein the plurality of electrical connectors are in electrical communication with at least one (a) ground and (b) a potential sufficient to draw out stray charges in the light blocking layer.

2. The semiconductor device according to claim 1, wherein the three or more electrical connectors are arranged in a row along the edge of the light, blocking layer.

3. The semiconductor device according to claim 1, wherein the three or more electrical connectors are arranged in rows along the edge of the light blocking layer.

4. The semiconductor device according to claim 3, wherein the three or more electrical connectors are arranged in rows along the edge of the light blocking layer in a staggered fashion.

5. The semiconductor device according to claim 1, wherein the three or more electrical connectors are in electrical communication with one another.

6. The semiconductor device according to claim 1, wherein the light blocking layer comprises the uppermost of a plurality of wiring layers formed above the signal processor.

7. The semiconductor device according to claim 1, wherein the light blocking layer comprises an intermediate wiring layer of a plurality of wiring layers formed above the signal processor.

8. The semiconductor device according to claim 1, wherein the three or more electrical connectors are laminated over the substrate.

9. The semiconductor device according to claim 1, wherein at least one of the three or more electrical connectors comprises a contact plug.

10. The semiconductor device according to claim 9, wherein the contact plug comprises at least one of tungsten, copper, aluminum, molybdenum, and doped polysilicon.

11. The semiconductor device according to claim 9, wherein the light blocking layer comprises a wiring layer; and
wherein the contact plug is integrally formed with the wiring layer that comprises the light blocking layer.

12. The semiconductor device according to claim 11, wherein the contact plug and the wiring layer comprise at least one of tungsten, copper, molydgenum, and aluminum.

13. The semiconductor device according to claim 1, wherein the substrate comprises a silicon-on-oxide substrate; and
wherein the light receiver and the signal processor are formed on a silicon layer of the silicon-on-oxide substrate.

14. The semiconductor device according to claim 13, wherein the silicon layer of the light receiver has a thickness operative to absorb ultraviolet light.

15. The semiconductor device according to claim 14, wherein the thickness of the silicon layer is between about 3 nanometers to about 36 nanometers.

16. The semiconductor device according to claim 1, wherein the substrate comprises a bulk substrate; and
wherein a filter is formed above the light receiver for transmitting only ultraviolet light.

17. The semiconductor device according to claim 1, further comprising
a display unit that displays a representation correlating the presence of light incident on the light receiver; and
a controller that controls the display unit and is in electrical communication with the signal processor.

18. A semiconductor device comprising:
a light receiver formed on a light receiver portion of a substrate;
a signal processor formed on a signal processor portion of the substrate, the signal processor, in electrical communication with the light receiver to receive an output signal from the light receiver;
alight blocking layer overlapping the signal processor to block light directly incident towards the signal processor portion of the substrate; and
a plurality of electrical connectors formed outside of an active area of the signal processor portion of the substrate, extending vertically with respect to the substrate, and blocking light obliquely incident on the signal processor portion of the substrate;
wherein at least one of the plurality of electrical connectors is in electrical communication with at least one of (a) ground and (b) a potential sufficient to draw out stray charges in the light blocking layer.

19. The semiconductor device according to claim 18, wherein at least one of the plurality of electrical connectors interposes an active area of the signal processor and the light receiver portion of the substrate; and
wherein at least one of the plurality of electrical connectors extends between the substrate and the light blocking layer.

20. The semiconductor device according to claim 18, wherein the plurality of electrical connectors are oriented in staggered rows.

* * * * *